US006987983B2

(12) United States Patent
Kondo et al.

(10) Patent No.: US 6,987,983 B2
(45) Date of Patent: Jan. 17, 2006

(54) RADIO FREQUENCY MONOLITHIC INTEGRATED CIRCUIT AND METHOD FOR MANUFACTURING THE SAME

(75) Inventors: Masao Kondo, Higashimurayama (JP); Katsuyoshi Washio, Tokorozawa (JP); Masatada Horiuchi, Koganei (JP)

(73) Assignee: Renesas Technology Corp., Tokyo (JP)

( * ) Notice: Subject to any disclaimer, the term of this patent is extended or adjusted under 35 U.S.C. 154(b) by 440 days.

(21) Appl. No.: 10/396,361

(22) Filed: Mar. 26, 2003

(65) Prior Publication Data

US 2004/0198253 A1    Oct. 7, 2004

(30) Foreign Application Priority Data

Mar. 28, 2002   (JP)   ............................. 2002-091040

(51) Int. Cl.
    *H04M 1/00*    (2006.01)
    *H05K 1/00*    (2006.01)

(52) U.S. Cl. ................... 455/550.1; 455/333; 361/748; 361/764

(58) Field of Classification Search ................. 455/91, 455/114.2, 333, 550.1; 361/718, 719, 748, 361/760, 764
See application file for complete search history.

(56) References Cited

U.S. PATENT DOCUMENTS

| 3,878,553 | A | * | 4/1975 | Sirles et al. ................. 257/654 |
| 5,705,855 | A | * | 1/1998 | Carson et al. ............... 361/760 |
| 5,752,182 | A | * | 5/1998 | Nakatsuka et al. ......... 455/333 |
| 5,893,027 | A | * | 4/1999 | Brueske ....................... 455/91 |
| 6,278,871 | B1 | * | 8/2001 | Jovenin et al. ............. 455/313 |
| 6,404,648 | B1 | * | 6/2002 | Slupe et al. ................. 361/760 |

FOREIGN PATENT DOCUMENTS

JP            7-283414            10/1995

* cited by examiner

*Primary Examiner*—Quochien B. Vuong
(74) *Attorney, Agent, or Firm*—Miles & Stockbridge P.C.

(57) ABSTRACT

The purpose of this invention is to realize a radio frequency monolithic integrated circuit high in performance, small in size and low in cost, where transistors and passive elements are arranged on a chip in which a conductive silicon substrate functions as a ground. Since the electromagnetic fields of passive elements induce a current in a conductive silicon substrate, a loss due to generation of Joule heat or the like occurs to lead to deterioration of the performance of the passive elements. To solve this problem, an SOI layer comprising a semiconductor layer having a large thickness and a high resistivity and a conductive silicon substrate is used, and passive elements and an active element are formed on the same substrate. Alternatively, a cavity is provided in the conductive substrate directly beneath the SOI layer in the region where the passive elements are formed, thereby attaining the object.

15 Claims, 13 Drawing Sheets

FIG. 12
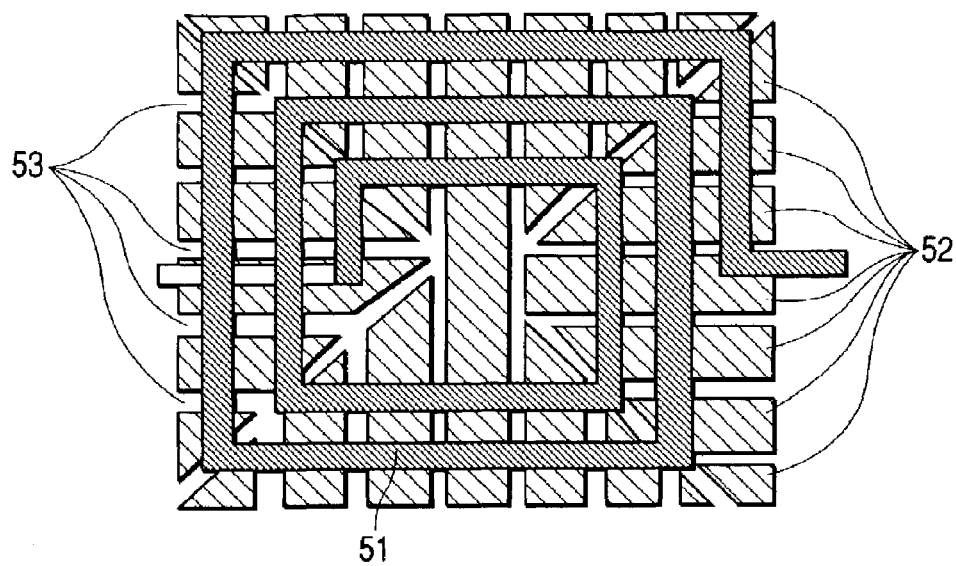
FIG. 13
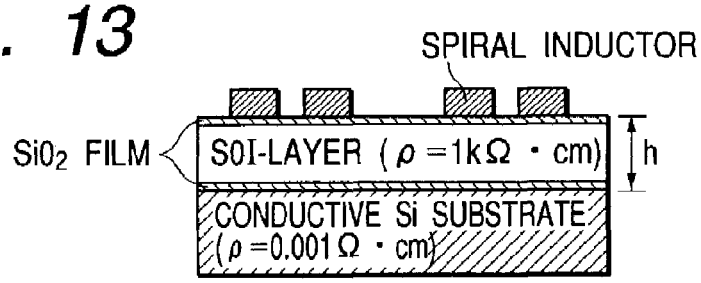
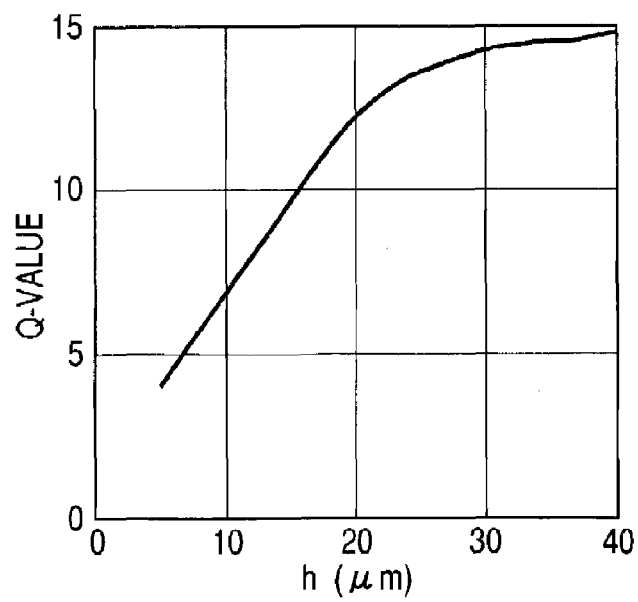

FIG. 14
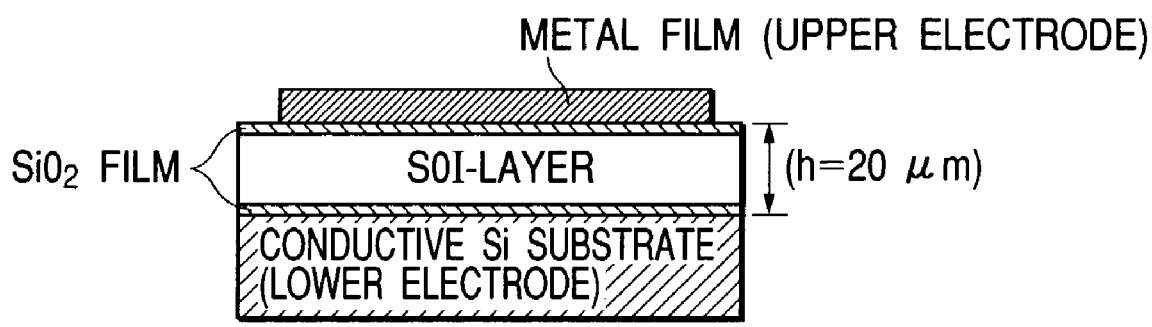
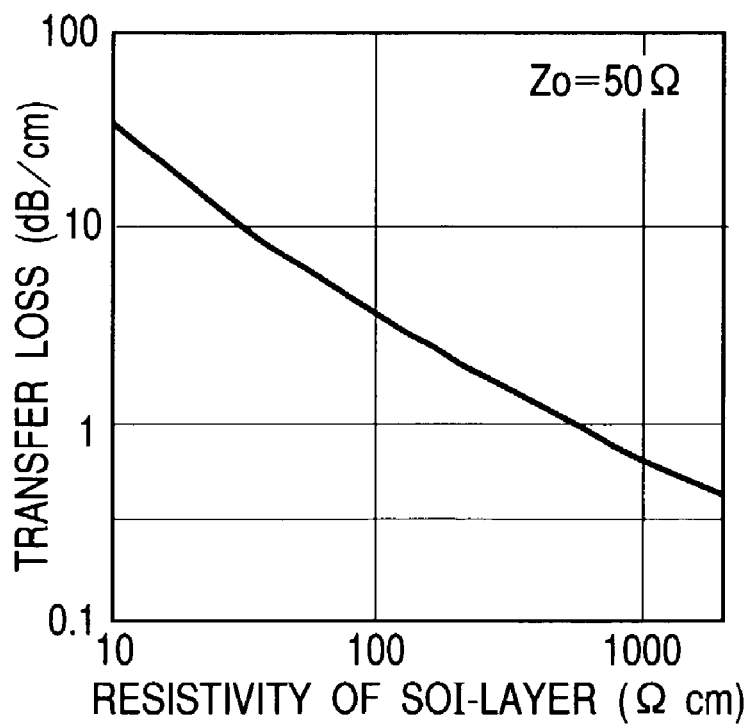

RADIO FREQUENCY MONOLITHIC INTEGRATED CIRCUIT AND METHOD FOR MANUFACTURING THE SAME

BACKGROUND OF THE INVENTION

1. Field of the Invention

The present invention relates to radio frequency monolithic integrated circuits, and particularly to a radio frequency monolithic integrated circuit for use in radiocommunication terminal transmitters such as cellular phones.

2. Description of the Related Art

There are known conventional semiconductor devices having a structure in which a transistor is formed on a silicon layer (SOI (Silicon On Insulator) layer) having high resistivity which is bonded onto a conductive silicon substrate through an insulation film therebetween, and a specified terminal of the transistor and the conductive silicon substrate are electrically connected by a plug structure penetrating through the SOI layer. Among them, a prior-art example closest to the present invention is disclosed in Japanese Patent Laid-open No. 7-283414.

In the prior-art example, an MOS transistor is formed on the SOI layer on the conductive silicon substrate. The MOS transistor is formed on the SOI layer in order to completely deplete the portion directly beneath a diffusion layer and the portion directly beneath a channel region, thereby reducing the parasitic capacitance. A hole penetrating through the SOI layer to reach the conductive silicon substrate is bored, and a conductive material is buried in the hole to form the plug structure. The source of the MOS transistor is connected to the plug structure, resulting in that the conductive silicon substrate as a ground and the source are electrically connected to each other.

SUMMARY OF THE INVENTION

In a general radio frequency circuit, a specified terminal of the transistor must be grounded. In the case where the electric power dealt with is high, such as the case of a power amplifying circuit, a large radio-frequency current flows through the wiring for grounding, so that it is necessary to reduce the parasitic inductance. For this purpose, it is desirable to use a grounding conductive silicon substrate as a support substrate and to achieve the grounding by a plug structure extending from the surface of the substrate to the conductive silicon substrate, because this structure makes it possible to largely reduce the length of the wiring, as compared with the case of grounding by use of a bonding wire.

On the other hand, in radio frequency circuits, it is desirable for reductions in cost and size that passive elements such as inductor, capacitance, and microstrip line used for impedance matching or the like and transistors as active elements are provided on the same chip. To simultaneously meet the above-mentioned two demands, it is necessary to arrange the passive elements together with the transistors on the chip comprising a conductive silicon substrate as the support substrate.

In this case, however, there arises the problem that the electromagnetic fields of the passive elements interact with the conductive silicon substrate, whereby the performance of the passive elements is deteriorated. More specifically, the electromagnetic fields of the passive elements induce a current in the conductive silicon substrate and Joule heat is generated, resulting in energy loss. In addition, in the case of a spiral inductor, an eddy current flowing in the direction opposite to the current in the inductor is generated in the conductive silicon substrate, leading to a lowering of the L-value.

As described in the specification of the above-mentioned prior art, the formation of the MOS transistor on the SOI layer in the prior art is made to completely deplete the portion directly beneath the diffusion layer and the portion directly beneath the channel region, hereby reducing the parasitic capacitance. To further facilitate the complete depletion, it is desirable to make the SOI layer thinner.

However, where passive elements are arranged on the SOI layer, thinning of the SOI layer reduces the distance between the passive elements and the conductive silicon substrate, with the result that the interactions therebetween become stronger, so that the performance of the passive elements would be further deteriorated.

It is an object of the present invention to improve the deterioration of characteristics of passive elements due to electric conduction in a substrate, in the case where the passive elements are arranged together with active elements on the substrate using a grounding conductive silicon substrate as a support substrate, and to realize a radio frequency monolithic integrated circuit with high performance comparable to that of a multi-chip module circuit in which passive elements and active elements are provided on different chips.

The above object can be attained by:

(1) a radio frequency monolithic circuit comprising a conductive substrate having a first resistivity, a first insulation film formed on a face of the conductive substrate, a semiconductor substrate provided on the insulation film and having a second resistivity higher than the first resistivity, a second insulation film formed on the semiconductor substrate, an active element formed in one region of the semiconductor substrate, and a passive element provided on the second insulation film, wherein a conductive region is provided which penetrates through the semiconductor substrate, the first insulation film and the second insulation film and which connects a predetermined terminal of the active element and the conductive substrate to each other.

Further, the above object can be attained by ensuring that:

(2) the thickness of the semiconductor substrate is greater than the thickness of the second insulation film or the thickness of a metal film formed on the second insulation film;

(3) the thickness of the semiconductor substrate is greater than the sum of the thicknesses of the second insulation film and the metal film;

(4) the second resistivity is not less than 100 Ω·cm;

(5) in the conductive substrate, a recessed portion as a cavity is provided in a region directly beneath the passive element;

(6) an insulating material is buried in the recessed portion as set forth in (5) above;

(7) in the semiconductor substrate, the conductive region is composed of a plurality of adjacent regions, and a region having a resistivity lower than that of the other regions of the semiconductor substrate is present between the adjacent conductive regions;

(8) the passive element comprises a microstrip line comprising the metal film on the second insulation film as an upper electrode and the conductive substrate as a lower electrode;

(9) the active element is a power amplifying transistor, and the passive element is an inductor or capacitance for impedance matching or a microstrip line;

(10) the power amplifying transistor is a bipolar transistor; or

(11) a base layer of the bipolar transistor is made of a silicon-germanium alloy.

In addition, the above object can be attained by:

(12) a method for manufacturing a radio frequency monolithic integrated circuit comprising the steps of:

bonding a conductive substrate having a first resistivity and a semiconductor substrate having a second resistivity higher than the first resistivity to each other, with a first insulation film provided on the conductive substrate therebetween, and thinning the semiconductor substrate to a predetermined thickness, providing a second insulation film on the semiconductor substrate, and forming an active element in one region of the semiconductor substrate and providing a passive element on the second insulation film, wherein the method further comprises the step of:

providing a conductive region which penetrates through the semiconductor substrate, the first insulation film and the second insulation film, and connecting a predetermined terminal of the active element and the conductive substrate to each other.

Further, the above object can be attained by ensuring that:

(13) the method further comprises the steps of:

providing a groove which penetrates through the semiconductor substrate, the first insulation film and the second insulation film, and burying a polycrystalline semiconductor material containing an impurity in a high concentration in the groove, and heat-treating the high-concentration impurity to diffuse the impurity into the semiconductor substrate;

(14) the method further comprises the steps of:

providing a recessed portion in the conductive substrate, and bonding the semiconductor substrate onto the conductive substrate provided with the recessed portion, with the first insulation film interposed therebetween; or

(15) the method of (14) further comprises the step of:

burying an insulating material in the recessed portion.

BRIEF DESCRIPTION OF THE DRAWINGS

FIG. 12 is a plain view showing desirable shapes of a recessed region formed in a conductive silicon substrate beneath a spiral inductor and a projected region surrounded thereby, in the radio frequency monolithic integrated circuit according to the third or fourth embodiment of the present invention;

FIG. 13 is a graph showing the relationship between the Q-value of a spiral inductor having a certain shape and the distance h from the spiral inductor to the conductive silicon substrate; and FIG. 14 is a graph showing the relationship between transfer loss and resistivity, in a microstrip line comprising a conductive silicon substrate as a lower electrode and a metal wiring formed on an SOI layer as an upper electrode and having a characteristic impedance of 50 Ω.

DESCRIPTION OF THE PREFERRED EMBODIMENTS

Figure 1:
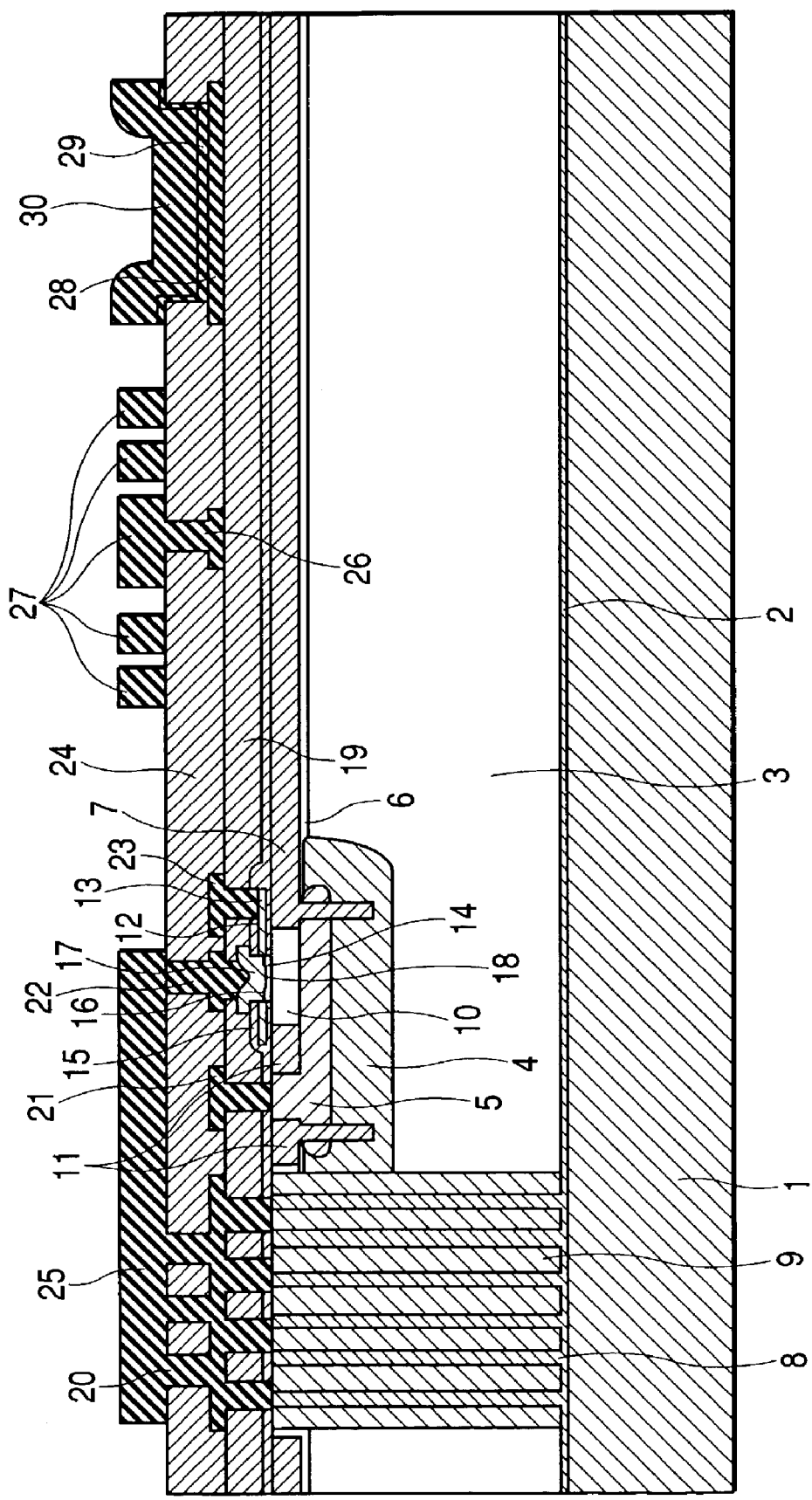
FIG. 1 shows a longitudinal sectional structure of an essential part of a radio frequency monolithic integrated circuit according to a first embodiment of the present invention.

The fundamental policy for solving the above-mentioned problems, according to the present invention, is as follows:

That is, the fundamental policy resides in using an SOI structure having specified properties and structure to thereby enlarge the distance between the passive elements on the SOI layer and the conductive silicon substrate therebeneath, to thereby reduce the interactions therebetween, and to reduce the loss arising from conductivity in the SOI layer.

First, a first means is that the SOI layer for forming an active element is made to simultaneously play the role of a spacer between the passive elements and the conductive silicon substrate. That is, the distance between the passive elements formed on the SOI layer and the conductive silicon substrate is preferably enlarged by use of an SOI layer having a large thickness and a high resistivity.

Now, the desirable thickness of the SOI layer to function as an effective spacer will be described. Of the passive elements, the one whose characteristics are most heavily influenced by the distance between itself and the conductive silicon substrate is the spiral inductor. The distance h from the spiral inductor to the conductive silicon substrate is precisely the sum of the thickness of an insulation film beneath the uppermost metal film constituting the spiral inductor, the thickness of the SOI layer, and the thickness of a buried $SiO_2$ layer.

Here, it is desirable for the buried $SiO_2$ film to be as thin as possible, in consideration of heat conductance efficiency, and a thickness of about 0.2 μm is sufficient to enable wafer bonding by adhesion. Therefore, the thickness of the buried $SiO_2$ film contributes little to the distance between the spiral inductor and the conductive silicon substrate. Consequently, the distance h is substantially equal to the sum of the thickness of the insulation film beneath the uppermost metal film and the thickness of the SOI layer.

Therefore, in order that the SOI layer is effective as the spacer for enlarging the distance between the spiral inductor and the conductive silicon substrate, it is desirable to set the thickness of the SOI layer to a non-ignorable value as compared with the thickness of the insulation film beneath the uppermost metal film, i.e., to a value comparable to or greater than the thickness of the insulation film.

FIG. 13 shows the relationship between the Q-value of a spiral inductor having a certain shape and the distance h. The Q-value is an index indicating the performance of the inductor, and a higher value thereof indicates a higher inductor performance. Where the distance h is small, a large current is induced in the conductive silicon substrate, and the Q-value is made to be small due to the generation of a magnetic field, which lowers the L-value, and the generation of Joule heat. As the distance h increases, the induced current becomes smaller and the Q-value is improved. Desirably, the distance h should be not less than about 25 μm, the value at which the Q-value is substantially saturated in relation to the increase of the distance h. The thickness of the insulation film beneath the uppermost metal film generally has an upper limit of about 10 μm, due to restrictions caused by the formation process technology therefor and production cost. Therefore, to set the distance h to a value not less than 25 μm, in practice, it is necessary for the thickness of the SOI layer to be not less than about 15 μm, namely, to be in excess of the thickness of the insulation film beneath the uppermost metal film.

In the present means, in order to prevent a bad influence of the induced current in the SOI layer on the passive elements, it is necessary to set the resistivity of the SOI layer to a sufficiently high value.

FIG. 14 shows the relationship between transfer loss and resistivity of the SOI layer, in a microstrip line comprising the conductive silicon substrate as a lower electrode and a metal wiring formed on the SOI layer as an upper electrode and having a characteristic impedance of 50 Ω. For comparison, the loss in the case of using only an $SiO_2$ film as a dielectric between the upper and lower electrodes is also shown. To be suited to practical use, the loss must, at most, be not more than about 10 times that in the case of using only the $SiO_2$ film. Therefore, it is necessary to set the resistivity of the SOI layer to a value at least not less than about 100 Ω·cm.

The means for forming a high resistivity layer on the conductive silicon substrate includes a method of forming an epitaxial layer having a low impurity concentration, other than the method of using the SOI layer. However, when epitaxial growth is conducted on the conductive silicon substrate having a high impurity concentration, auto-doping of the impurity from the conductive silicon substrate occurs, and, therefore, it is difficult to set the resistivity of the epitaxial layer to a value not less than 100 Ω·cm. In the case of the SOI layer, on the other hand, a silicon layer having a high resistivity of not less than 1 kΩ·cm can be easily formed by bonding a high resistivity silicon substrate to the conductive silicon substrate. Accordingly, it is inevitable to adopt the SOI layer, in order to solve the problems.

In the present means, in the same manner as in the prior art, grooves or holes extending from the surface of the SOI layer and penetrating through the SOI layer and the buried $SiO_2$ film to the conductive silicon substrate are provided, and a conductive material is buried in the grooves or holes to form a plug structure, whereby a specified electrode of the active element formed on the SOI layer is grounded. It should be noted here that since the SOI layer is thicker than that in the prior art, if the plug structure is composed of only a single groove or hole as in the prior art, the buried conductive material would be elongated, leading to high resistance. To avoid this problem, preferably a plurality of grooves or holes which are filled with the conductive material are arranged, and an impurity is diffused into the portions between the grooves or holes, thereby making the plug structure thicker.

A second means is that a recessed portion may be provided in the surface of the conductive silicon substrate directly beneath the SOI layer, in the substrate structure in which the SOI layer is formed on the conductive silicon substrate. More specifically, the surface of the conductive silicon substrate directly beneath the SOI layer in the region where the passive element is disposed is dug down to enlarge the distance between the passive element and the conductive silicon substrate. The portion thus dug down may be left as a cavity, or may be filled with an insulating material. The flat SOI layer covers the recessed portion from the upper side, and each of the layers present on the upper side of the SOI layer is flat, so that there is no difficulty in forming the device that might otherwise arise from the ruggedness of the surface of the substrate. The conductive silicon substrate in the region where the active element is formed on the SOI layer is not dug down, and the same plug structure as in the first means is formed, and a specified electrode of the active element is grounded.

According to the present means, even in the case where the thickness of the SOI layer is small, it is possible to enlarge the distance between the passive element and the conductive silicon substrate by enlarging the depth in digging down the conductive silicon substrate. Therefore, as compared with the first means, the second means has the characteristic feature that the groove or hole for the plug structure is shallower, so that it is easier to form the plug structure, and the resistance can be made lower.

A microstrip line can be constructed based on the substrate structure to which the first or second means has been applied. To be more specific, an upper electrode of the microstrip line may be constituted of a metal wiring formed on the SOI layer, and a lower electrode of the microstrip line may be constituted of the conductive silicon substrate.

By arranging the present microstrip line on the same chip as for the passive elements and the active element to which the first or second means has been applied, it is possible to realize a radio frequency monolithic integrated circuit including the microstrip line. Thus, it is possible to enlarge the distance between the upper and lower electrodes, as compared with the conventional case where the upper and lower electrodes of the microstrip line are respectively constituted of two metal films which are formed on the substrate.

As a result, there is obtained the effect that the microstrip line can be made wider and the conductor loss can be made smaller, when compared for the same characteristic impedance.

Next, the constitution of a power amplifying radio frequency monolithic integrated circuit, to which the above-mentioned first or second means has been applied, will be described. A power bipolar transistor or a power MOS transistor formed on the SOI layer is used as an active element, whereas a spiral inductor composed of a metal film or an MIM (Metal Insulator Metal) capacitance composed of two metal films and an insulation film sandwiched therebetween or the above-mentioned microstrip line formed on an insulation film on the SOI layer is used as a passive element. The transistor consists of two transistors, one for the driving stage and the other for the power output stage.

The emitter in the case of the bipolar transistor, or the source in the case of the MOS transistor, is grounded to the conductive silicon substrate through the above-mentioned plug structure penetrating through the SOI layer. An impedance matching circuit composed of the spiral inductor, the MIM capacitance or the microstrip line is arranged on the input side of the driving-stage transistor, on the output side of the output-stage transistor, and between the two transistors.

In the case where the transistor is the bipolar transistor and the base layer thereof is formed of a silicon-germanium alloy, a higher cutoff frequency and a lower base resistance can be obtained and, therefore, it is possible to enhance the power amplifying efficiency and to reduce noise, as compared with the case where the base layer is formed only of silicon.

In order to realize the substrate structure in which the recessed portion is formed in the surface of the conductive silicon substrate directly beneath the SOI layer, described as the second means above, the following means may be used. First, the surface of the conductive silicon substrate in a specified region is dug down. The recessed portion thus formed may be left as a cavity, or may be filled with an insulation film by an ordinary means.

Next, the surface is oxidized to form an $SiO_2$ film, which becomes the buried $SiO_2$ film in the SOI structure. Subsequently, the high resistivity silicon substrate and the conductive silicon substrate provided with the recessed portion are adhered to each other, with the face sides of the two substrates facing each other. The $SiO_2$ film which becomes the buried $SiO_2$ film may be formed by oxidizing the surface of the conductive silicon substrate, as has been described above. Alternatively, the $SiO_2$ film may be formed by oxidizing the surface of the high resistivity silicon substrate. Further, these substrates are bonded to each other by heating to a high temperature in an $N_2$ atmosphere. Thereafter, the high resistivity silicon substrate is processed to a thin layer by polishing.

<First Embodiment>

A first embodiment of the present invention will be described based on FIGS. 1, 2 and 3.

FIG. 1 shows a longitudinal sectional structure of an essential part of a radio frequency monolithic integrated circuit according to the first embodiment of the present invention. In the figure, reference numeral 1 denotes an $n^+$ type conductive silicon substrate, 2 denotes an $SiO_2$ layer, 3 denotes a high resistivity Si layer, 4 denotes a $p^-$ type Si layer, 5 denotes an $n^+$ type Si layer, 6 denotes an $n^-$ type Si layer, 7 denotes an $SiO_2$ film, 8 denotes an $n^+$ type polycrystalline Si film, 9 denotes an $n^+$ type Si layer, 10 denotes an $n^-$ type Si layer, 11 and 12 each denote an $SiO_2$ film, 13 denotes a $p^+$ type polycrystalline Si film, 14 denotes a p type SiGe layer, 15 and 16 each denote an $SiO_2$ film, 17 denotes an $n^+$ type polycrystalline Si film, 18 denotes an $n^+$ type Si layer, 19 denotes an $SiO_2$ film, 20 to 23 each denote a metal film, 24 denotes an $SiO_2$ film, 25 to 28 each denote a metal film, 29 denotes an $SiO_2$ film, and 30 denotes a metal film.

Of the above layers or films, the $n^+$ type Si layer 5 functions as a collector buried impurity layer of a bipolar transistor, the $n^-$ type Si layer 10 functions as a low concentration collector layer, the p type SiGe layer 14 functions as a base layer, and the $n^+$ type polycrystalline Si film 17 functions as an emitter polycrystalline Si film. Of the metal films, the metal film 21 functions as the base electrode of the bipolar transistor, the metal film 22 functions as the emitter electrode, and the metal film 23 functions as the collector electrode.

The $n^+$ type polycrystalline Si film 8 and the $n^+$ type Si layer 9 constitute a plug structure which penetrates through the high resistivity Si layer (SOI layer) 3 and the buried $SiO_2$ film 2. This plug structure is connected to the emitter electrode 22 of the bipolar transistor through the metal films 20 and 25, thereby electrically connecting the emitter electrode 22 and the $n^+$ type conductive silicon substrate 1, which functions as a ground, to each other.

The metal films 26 and 27 constitute a spiral inductor, whereas metal films 28 and 30 and the $SiO_2$ film 29 constitute an MIM capacitance, and they are arranged on the same substrate as for the bipolar transistor.

In the present embodiment, 1 may be a $p^+$ type conductive silicon substrate and 8 and 9 may be a $p^+$ type polycrystalline Si film and a $p^+$ type Si layer, respectively.

The thickness of the $SiO_2$ film beneath the metal film 27 constituting the spiral conductor, i.e., the distance from the lower surface of the metal film 27 to the surface of the $n^-$ type Si layer 6 is about 5 μm.

On the other hand, the thickness of the high resistivity Si layer 3 on the buried $SiO_2$ film 2 is about 20 μm, the thickness of the buried $SiO_2$ film 2 is about 0.2 μm, and the distance from the lower surface of the metal film 27 to the $n^+$ type conductive silicon substrate 1 is about 25 μm. The resistivity of the $n^+$ type conductive silicon substrate 1 is about 0.001 Ω·cm, and the resistivity of the high resistivity Si layer 3 is about 1 kΩ·cm.

Figure 2:
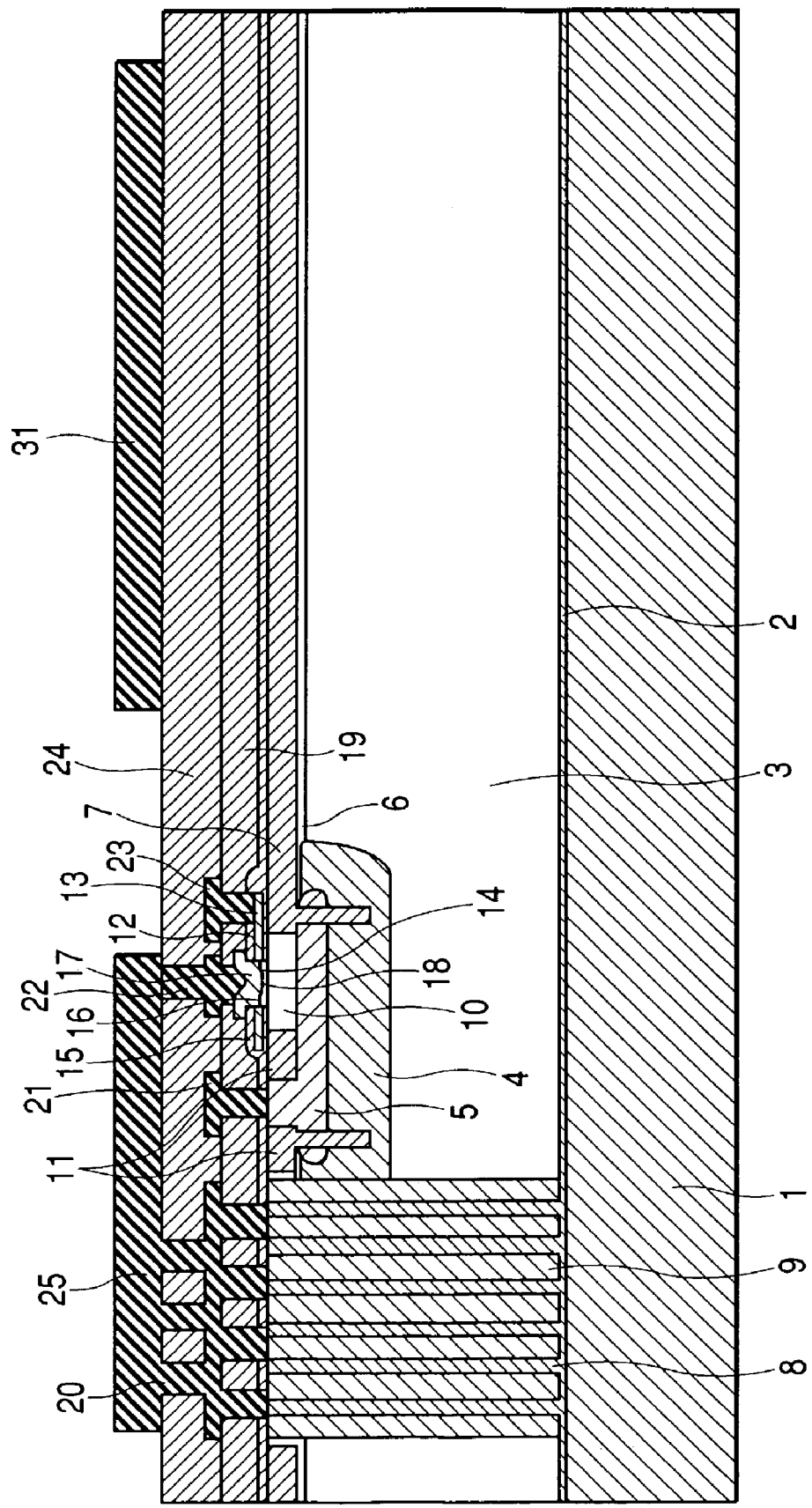
FIG. 2 shows a longitudinal sectional structure of an essential part different from that of FIG. 1, of the radio frequency monolithic integrated circuit according to the first embodiment of the present invention.

FIG. 2 shows a longitudinal sectional structure of an essential part different from that of FIG. 1, of the radio frequency monolithic integrated circuit according to the present embodiment. In this figure, reference numerals 1 to 25 denotes the same components as those in FIG. 1, and the functions of the components are the same as in FIG. 1. Reference numeral 31 denotes a metal film. The metal film 31 constitutes the upper electrode of the microstrip line, and the conductive silicon substrate 1 constitutes the lower electrode of the microstrip line.

Figure 3:
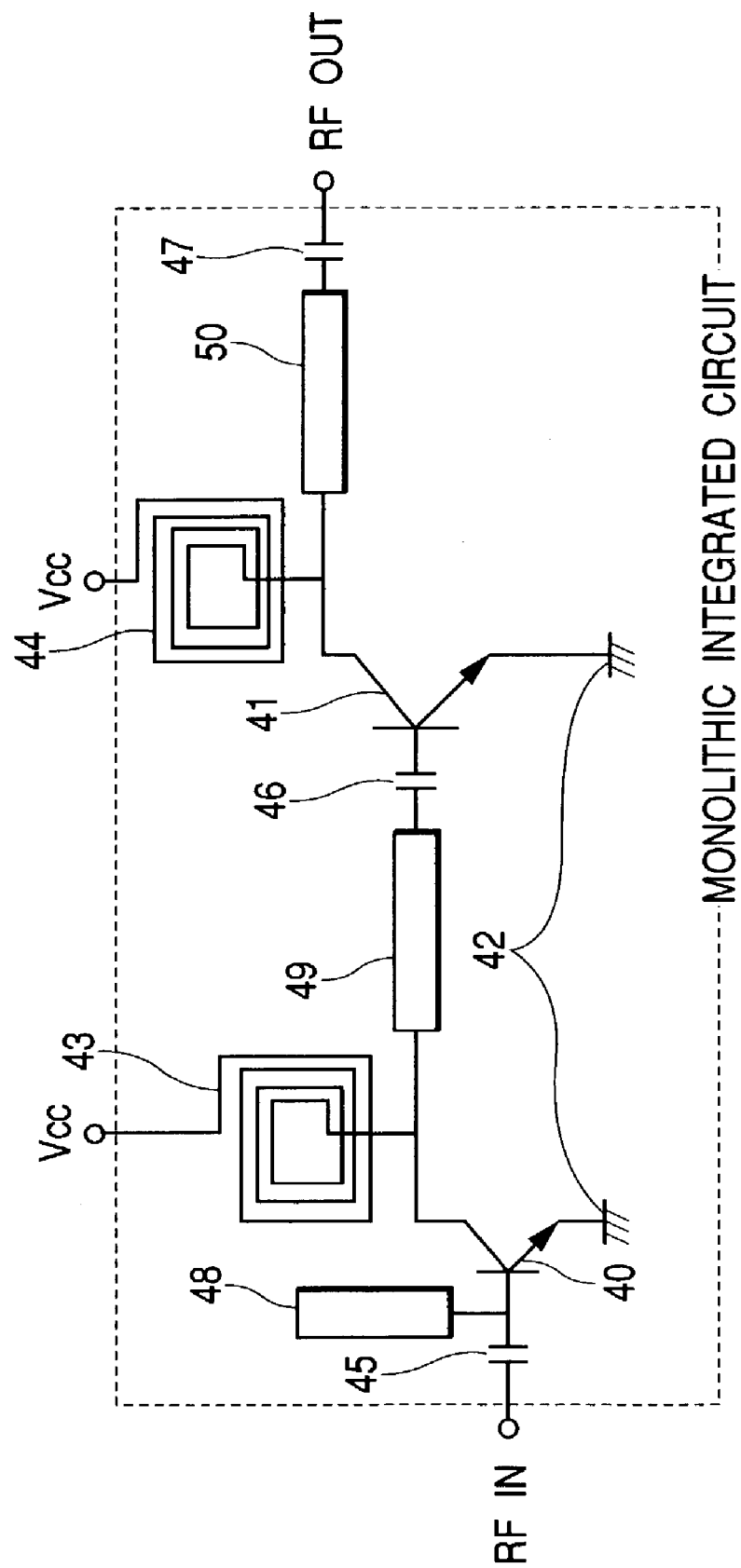
FIG. 3 is an overall circuit diagram of the radio frequency monolithic integrated circuit diagram according to the first embodiment of the present invention.

The overall circuit diagram of the present embodiment is shown in FIG. 3. In this figure, reference numerals 40 and 41 denote bipolar transistors, 42 denotes a conductive silicon substrate playing the role of a ground, 43 and 44 denote spiral inductors, and 45, 46 and 47 denote MIM capacitances, all being shown in FIG. 1. Reference numerals 48, 49 and 50 denote transmission lines formed of the microstrip lines shown in FIG. 2.

The present circuit is a power amplifying circuit. The circuit is an emitter-grounded 2-stage amplifying circuit, in which the transistors 40 and 41 are for the driving stage and the output stage, respectively. The emitters of these transistors are connected to the conductive silicon substrate 42 which functions as a ground. Impedance matching circuits constituted of the spiral inductors 43 and 44, the MIM capacitances 45 to 47, and the transmission lines 48 to 50 are arranged between the two transistors, on the input side of the driving-stage transistor, and on the output side of the output-stage transistor. These transistors and passive elements on the circuit diagram are formed together on the same substrate, as shown in FIGS. 1 and 2.

Next, the method for manufacturing the radio frequency monolithic integrated circuit according to the present embodiment will be described referring to FIGS. 5A to 5G. These figures show a longitudinal sectional structure, in essential manufacturing steps, of an essential part of the radio frequency monolithic integrated circuit.

Figure 5A:
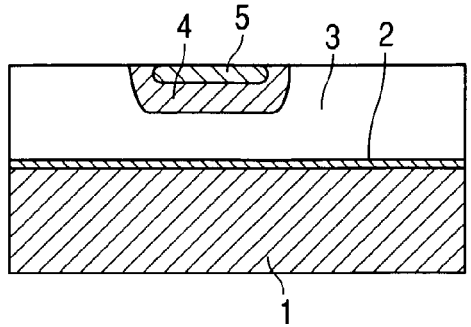
FIGS. 5A to 5G each show a longitudinal sectional structure of an essential part, in essential steps of a method for manufacture, of the radio frequency monolithic integrated circuit according to the first embodiment of the present invention.

First, the high resistivity silicon substrate having a resistivity of 1 kΩ·cm is adhered to the n$^+$ type conductive silicon substrate 1 though the SiO$_2$ film, and is thinned to a film by polishing, thereby forming a high resistivity Si (SOI) layer 3, by ordinary methods. Next, a p$^-$ type Si layer 4 is formed in a specified region of the high resistivity Si layer 3 by an ordinary method, and an n$^+$ type Si layer 5 is formed on the inside thereof (FIG. 5A).

Figure 5B:
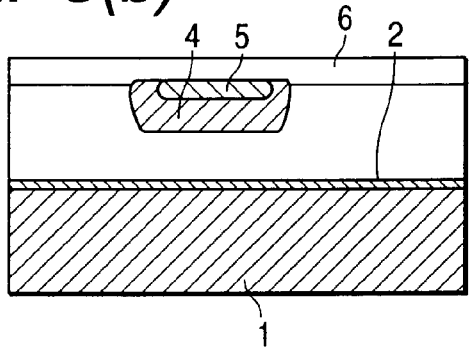

Next, an n$^-$ type Si layer 6 is epitaxially grown on the high resistivity Si layer 3 by an ordinary chemical vapor deposition (CVD) method (FIG. 5B).

Figure 5C:
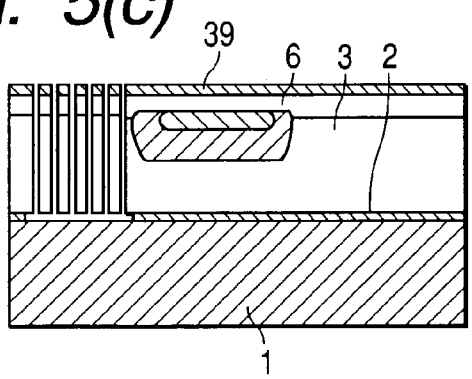

Subsequently, a SiO$_2$ film 39 is formed on the n$^-$ type Si layer 6 by an ordinary thermal oxidation method or CVD method. Thereafter, a plurality of grooves penetrating through the SiO$_2$ film 39, the n$^-$ type Si layer 6 and the high resistivity Si layer 3 to reach the SiO$_2$ film 2 are formed by ordinary photolithography and dry etching. Further, the SiO$_2$ film 2 present in the bottoms of the grooves and in the surroundings is removed by wet etching (FIG. 5C).

Figure 5D:
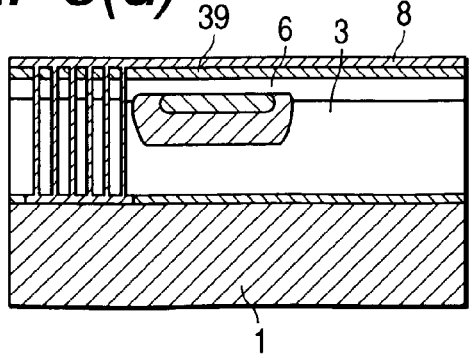
Figure 5E:
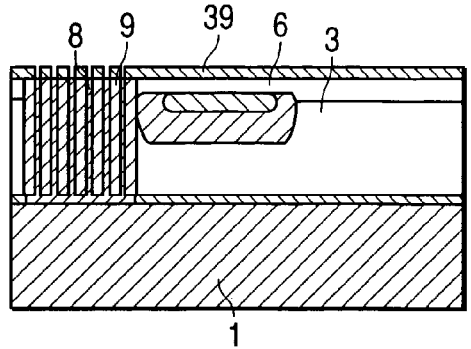
Figure 5F:
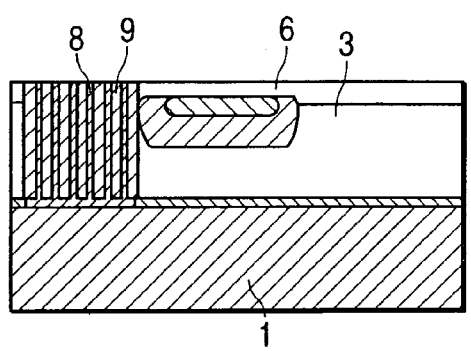

Next, an n$^+$ type polycrystalline Si film 8 is built up so as to fill the grooves by an ordinary CVD method (FIG. 5D). Subsequently, the n$^+$ type polycrystalline Si film 8 present in the other areas than the grooves is removed by an ordinary dry etching method, and then P contained in the n$^+$ type polycrystalline Si film 8 is diffused into the high resistivity Si layer 3 by heating, to form an n$^+$ type Si layer 9 (FIG. 5E) Further, the SiO$_2$ film 39 is removed by an ordinary wet etching method (FIG. 5F).

Figure 5G:
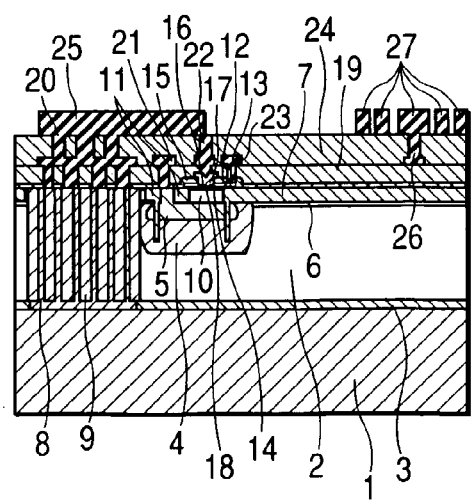

Subsequently, a bipolar transistor using a silicon-germanium alloy for the base is formed by an ordinary method in the region where the p$^-$ type Si layer 4 and the n$^+$ type Si layer 5 are formed. Further, metal films 20 to 23 and 25 to 27 and an inter-layer insulation film 24 consisting of an SiO$_2$ film are formed by ordinary methods, to form required wiring, and passive elements such as spiral inductors are formed on the upper side of the high resistivity Si layer 3 by ordinary methods (FIG. 5G).

According to this first embodiment, the passive elements suitable for practical use which have been unattainable by the prior art, i.e., spiral inductors, MIM capacitances, microstrip lines and the like can be realized, together with the active elements, on the SOI substrate in which the conductive silicon substrate as a ground is used as a support substrate. As a result, it is possible to realize a radio frequency monolithic integrated circuit with high performance comparable to that of a multi-chip module circuit device in which these passive elements are formed on different chips than that for the active elements.

In addition, according to the present embodiment, the plug structure for electrical connection between the emitters of transistors and the conductive silicon substrate functioning as a ground can be made to have a low resistance, so that the parasitic emitter resistance can be reduced, and the deterioration of the performance due to the parasitic resistance can be reduced.

Furthermore, according to this embodiment, an SiGe HBT (Hetero-junction Bipolar Transistor) using a silicon-germanium alloy for the base is used as the transistor. The SiGe HBT has a high cutoff frequency, a low base resistance, and a small amplification distortion. Therefore, the power amplifying circuit according to this embodiment has the characteristic features of high power amplification factor, low noise, and low distortion.

<Second Embodiment>

A second embodiment of the present invention will be described with reference to on FIG. 4. This figure shows a vertical sectional structure of an essential part of a radio frequency monolithic integrated circuit according to the second embodiment of the present invention.

In this figure, reference numerals 1 to 31 denotes the same components as those in FIG. 1 above. Reference numeral 32 denotes an SiO$_2$ film, 33 denotes an n$^+$ type polycrystalline Si film, 34 denotes a p$^-$ type Si layer, and 35 and 36 each denote an n$^+$ type Si layer. Of these films or layers, the SiO$_2$ film 32 functions as the gate insulation film of a MOS transistor, the n$^+$ type polycrystalline Si film 33 functions as the gate electrode, the n$^+$ type Si layer 35 functions as the source, and the n$^+$ type Si layer 36 functions as the drain. Of the metal films, a metal film 21 functions as the source electrode, and a metal film 23 functions as the drain electrode.

The present embodiment is the same as the above-described first embodiment, except that the bipolar transistor is replaced with the MOS transistor. In the same manner as in the first embodiment shown in FIG. 1, an n$^+$ type polycrystalline Si film 8 and an n$^+$ type Si layer 9 constitute a plug structure which penetrates through a high resistivity Si layer (SOI layer) 3 and a buried SiO$_2$ film 2. This plug structure is connected to the source electrode 21 of the MOS transistor through metal films 20 and 25, thereby electrically connecting the source electrode 21 and an n$^+$ type conductive silicon substrate 1, which functions as a ground, to each other. Metal films 26 and 27 constitute a spiral inductor, whereas metal films 28 and 30 and an SiO$_2$ film 29 constitute an MIM capacitance, and they are arranged on the same substrate as for the MOS transistor. In this figure, transmission lines constituted of microstrip lines are omitted.

In the present embodiment, reference numeral 1 may be a p$^+$ type conductive silicon substrate and 8 and 9 may be a p$^+$ type polycrystalline Si film and a p$^+$ type Si layer, respectively. The thickness of the SiO$_2$ film beneath the metal film 27 constituting the spiral inductor and the thickness of the high resistivity Si layer 3 are the same as in the first embodiment.

According to this second embodiment, the passive elements suitable for practical use which have been unattainable by the prior art, i.e., spiral inductors, MIM capacitances, microstrip lines and the like can be realized, together with the active elements, on the SOI substrate in which the conductive silicon substrate functioning as a ground is used as a support substrate, in the same manner as in the first embodiment.

As a result, it is possible to realize a radio frequency monolithic integrated circuit with high performance comparable to that of a multi-chip module circuit in which these passive elements are provided on different chips than that for the active elements. In addition, according to the present embodiment, the plug structure for electrical connection between the source of the transistor and the conductive silicon substrate functioning as a ground can be made to have a low resistance, so that the parasitic source resistance can be reduced, and the deterioration of performance due to the parasitic resistance can be reduced.

<Third Embodiment>

Figure 6:
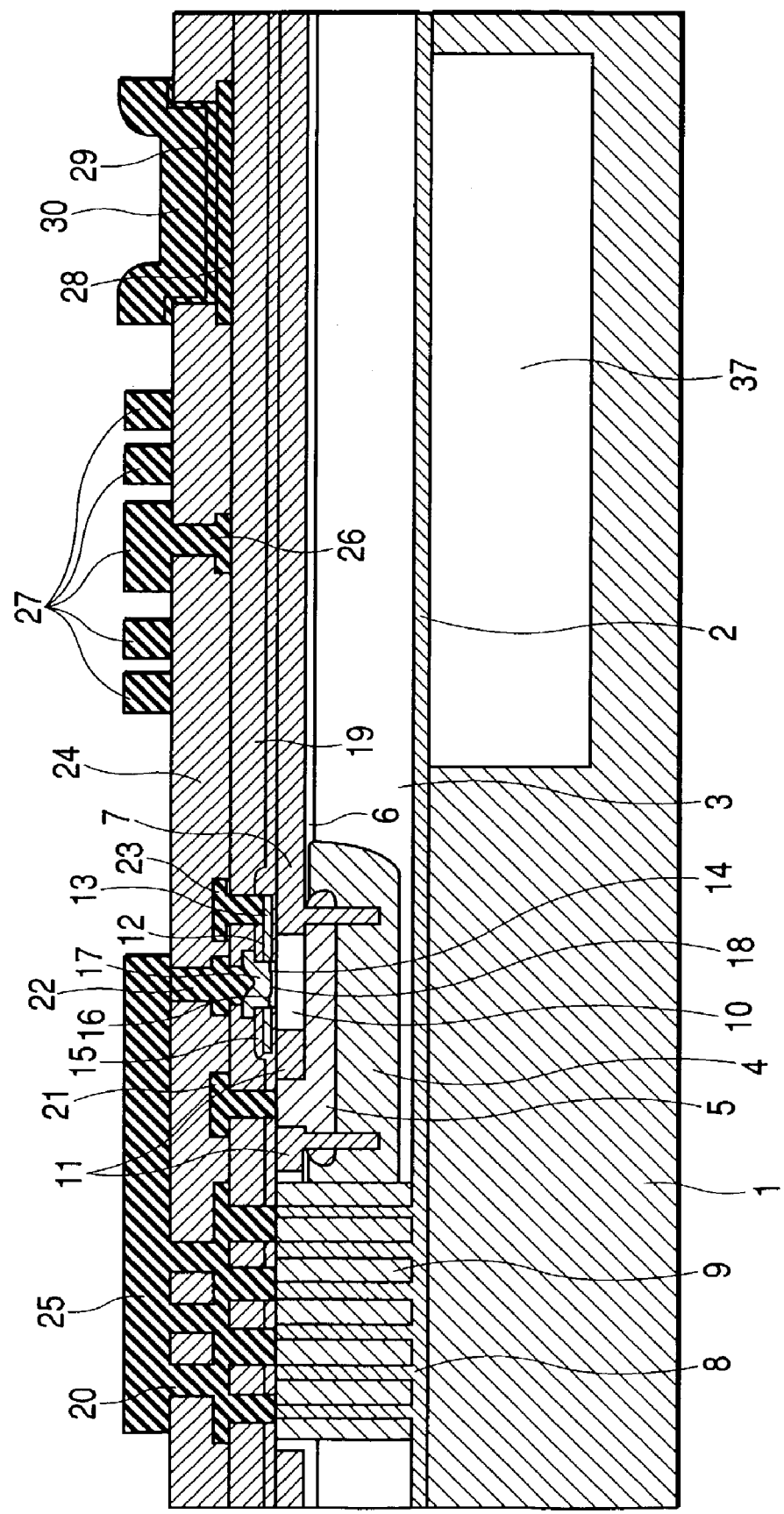
FIG. 6 shows a longitudinal sectional structure of an essential part of a radio frequency monolithic integrated circuit according to a third embodiment of the present invention.

A third embodiment of the present invention will be described with reference to FIG. 6. FIG. 6 shows a vertical sectional structure of an essential part of a radio frequency monolithic integrated circuit according to the third embodiment of the present invention.

In the figure, reference numerals 1 to 31 denote the same components as those in FIG. 1 of the first embodiment above. The functions of these embodiments are also the same as in the case of the first embodiment. Symbol 37 denotes a cavity. In this embodiment, in the region where a spiral inductor composed of metal films 26 and 27 and an MIM capacitance composed of metal films 28 and 30 and an $SiO_2$ film 29 are formed, a recessed portion is formed in a conductive silicon substrate 1, and the portion is left as the cavity. The fundamental structure other than this point is the same as in the first embodiment shown in FIG. 1.

It should be noted here that the thickness of a high resistivity Si layer 3 is about 10 $\mu$m, about one half of that in the first embodiment. The depth of the recessed portion in the conductive silicon substrate 1 is about 10 $\mu$m. The thickness of the $SiO_2$ film beneath the metal film 27 constituting the spiral inductor, i.e., the distance from the lower surface of the metal film 27 to the surface of the $n^-$ type Si layer 6 is about 5 $\mu$m, with the result that the distance from the lower surface of the metal film 27 to the $n^+$ type conductive silicon substrate 1 is about 25 $\mu$m.

Next, of the method for manufacturing the radio frequency monolithic integrated circuit according to the present embodiment, the points different from those in the above-described first embodiment will be described, referring to FIGS. 10A to 10D. These figures show a longitudinal sectional structure, in essential manufacturing steps, of an essential part of the radio frequency monolithic integrated circuit.

Figure 10A:
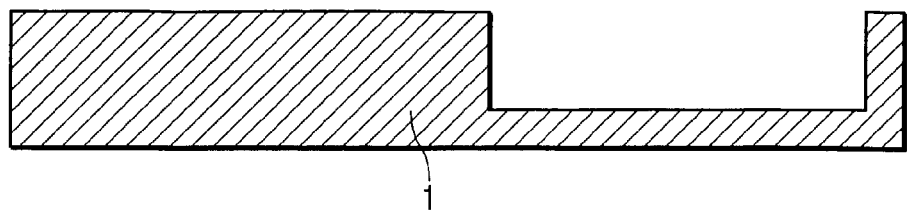
FIGS. 10A to 10D each show a longitudinal sectional structure of an essential part, in essential steps of a method for manufacture, of the radio frequency monolithic integrated circuit diagram according to the third embodiment of the present invention.
Figure 10B:
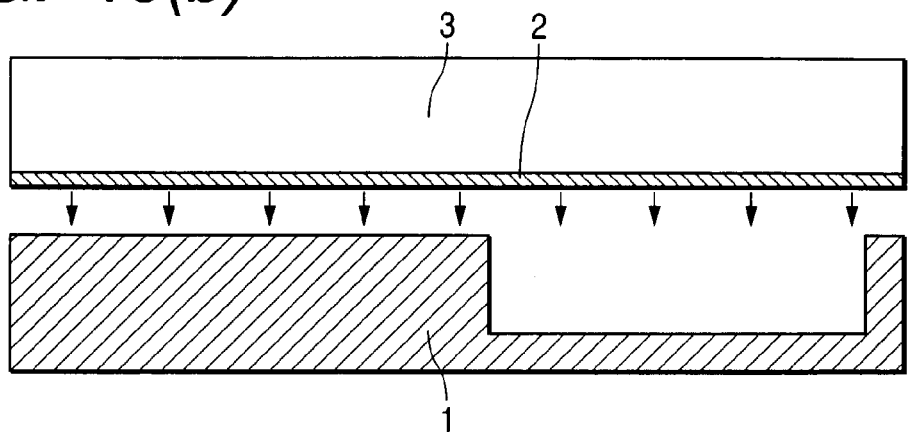

First, a recessed portion with a depth of about 10 $\mu$m is formed in a specified region of the conductive silicon substrate 1 by ordinary photolithography and dry etching (FIG. 10A). Next, a high resistivity silicon substrate 3 having a resistivity of 1 k$\Omega$·cm and provided thereon with an $SiO_2$ film 2 having a thickness of 0.2 $\mu$m is adhered to the conductive silicon substrate 1, with their face sides facing each other. In this step, the $SiO_2$ film 2 may be formed not on the surface of the high resistivity silicon substrate 3 but on the surface of the conductive silicon substrate 1 (FIG. 10B).

Figure 10C:
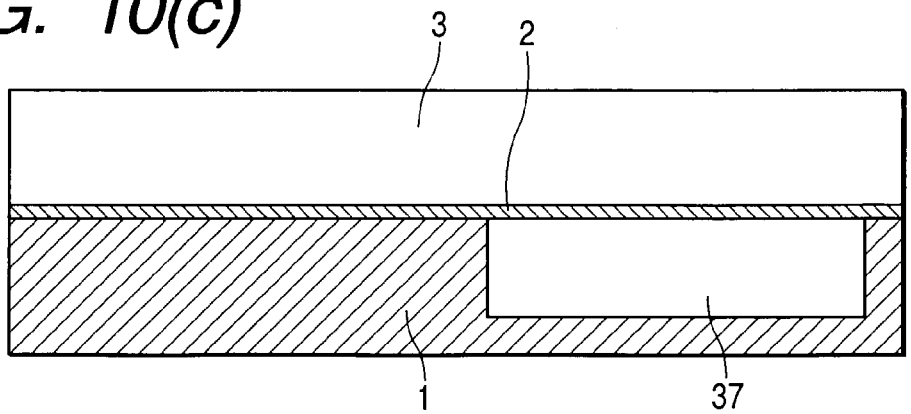
Figure 10D:
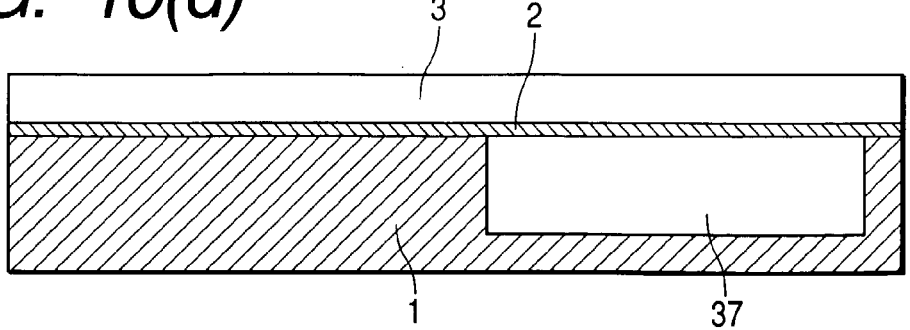

Subsequently, the two substrate thus adhered are bonded to each other by heating in a nitrogen atmosphere. As a result, a cavity 37 is provided between the conductive silicon substrate 1 and the high resistivity silicon substrate 3 (FIG. 10C). Further, the high resistivity silicon substrate 3 is thinned, by polishing, to a film having a thickness of about 10 $\mu$m (FIG. 10D). The manufacturing steps from this on are the same as in the first embodiment described above.

Figure 8:
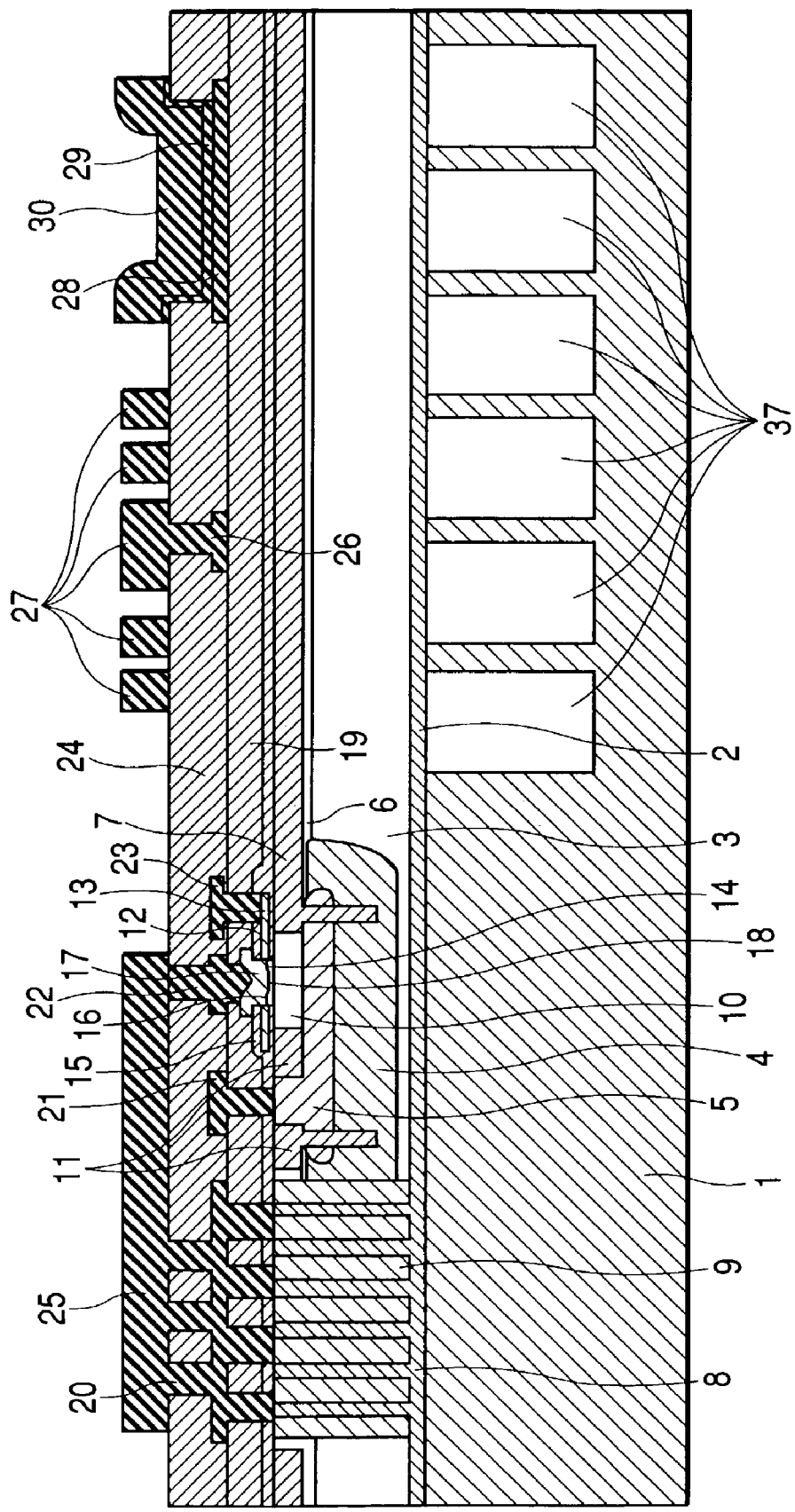
FIG. 8 shows a longitudinal sectional structure of an essential part of one modification of the radio frequency monolithic integrated circuit according to the fourth embodiment of the present invention.

In the present embodiment, other than the method in which one recessed portion is provided in one region where the passive elements are formed, as shown in FIG. 3, a plurality of recessed portions divided into small areas may be provided in one region where the passive elements are formed, as shown in FIG. 8. In that case, the strength of the stress generated due to the presence of the cavity 37 in the steps of the polishing and the heat treatment can be lowered, and the lowering of yield arising from cracks and crystal defects due to the stress can be improved. In this case, when the regions surrounded by the recessed portions, namely, the projected regions between the cavities in FIG. 8 are processed into flat surface shapes so that an electric current would not easily be induced there by the magnetic field generated by the spiral inductor, it is possible to further enhance the performance of the spiral inductor.

FIG. 12 shows a desirable flat surface shape of the recessed region formed in the conductive silicon substrate beneath the spiral inductor and the projected region surrounded thereby in the third or fourth embodiment of the present invention. In the figure, reference numeral 51 denotes a metal film wiring constituting the spiral inductor, 52 denotes the recessed portions, and 53 denotes the projected region surrounded by the recessed portions. Owing to the current in the spiral inductor, an eddy current in a direction opposite to the direction of the current in the spiral inductor would be induced in the conductive silicon substrate 1.

When the longitudinal direction of the projected portion region 53 is set perpendicular to the direction of the current in the spiral inductor closest thereto as shown in this figure, the eddy current would not easily flow, and the performance of the spiral inductor can be further enhanced.

According to this third embodiment, the same effect as in the first embodiment can be realized. Further, as compared with the first embodiment, the high resistivity Si layer 3 is thinner, so that it is easier to form the plug structure penetrating through this layer and the $SiO_2$ film 2 to the conductive silicon substrate 1. This is because the making of the grooves or holes by dry etching and the burying of the conductive polycrystalline Si film by a CVD method, which are required for forming the plug structure, are easier to carry out as the high resistivity Si layer 3 is thinner.

<Fourth Embodiment>

Figure 7:
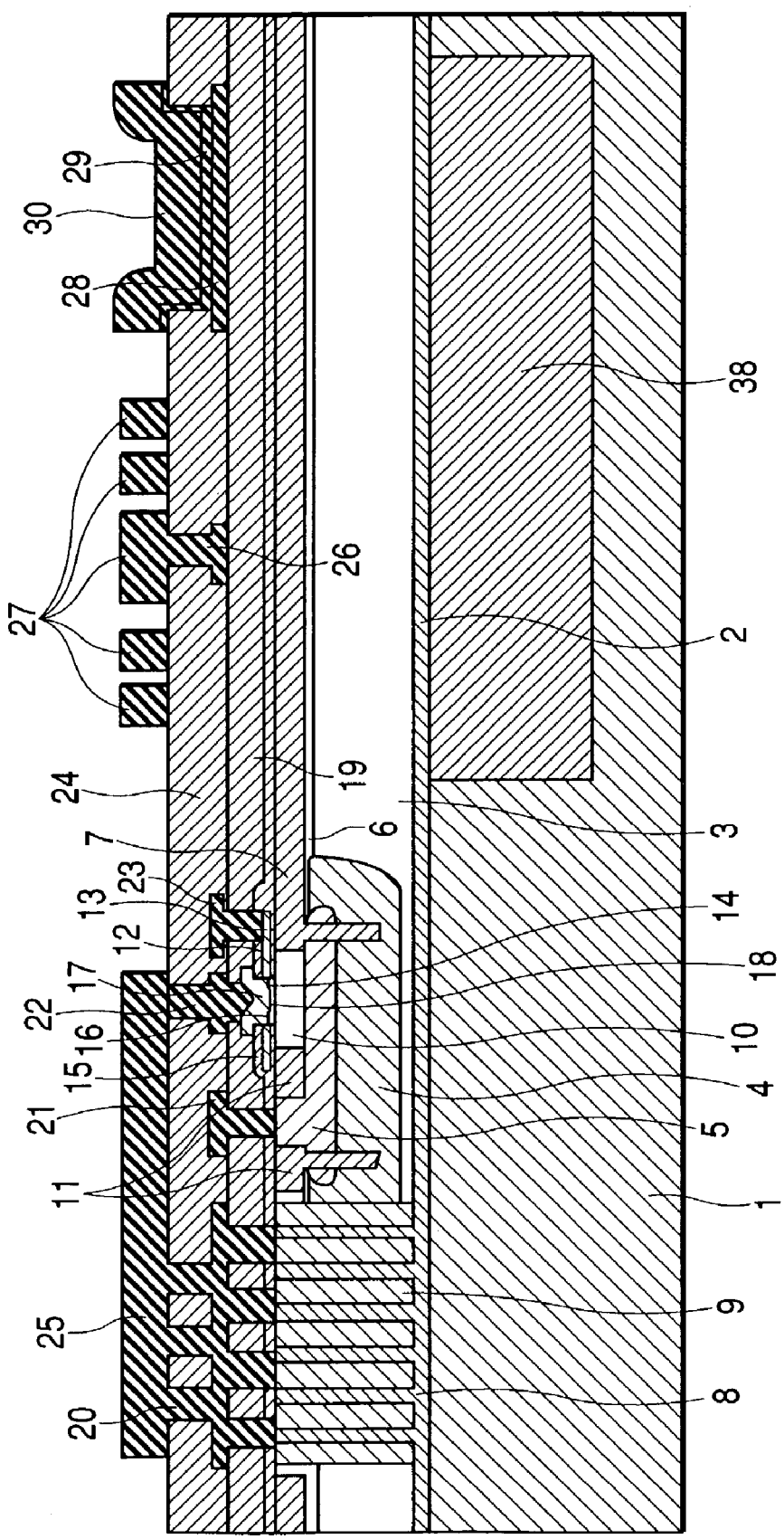
FIG. 7 shows a longitudinal sectional structure of an essential part of a radio frequency monolithic integrated circuit according to a fourth embodiment of the present invention.

A fourth embodiment of the present invention will be described with reference to FIG. 7. FIG. 7 shows a longitudinal sectional structure of an essential part of a radio frequency monolithic integrated circuit according to the fourth embodiment of the present invention.

In this figure also, symbols 1 to 37 denote the same components as those in FIG. 1 of the first embodiment. The functions of these components are also the same as in the first embodiments. Symbol 38 denotes an $SiO_2$ film. In this embodiment, in the region where a spiral inductor composed of metal films 26 and 27 and an MIM capacitance composed of metal films 28 and 30 and an $SiO_2$ film 29 are formed, a recessed portion is provided in a conductive silicon substrate 1, and the $SiO_2$ film 38 is buried in the portion.

As compared with the third embodiment described above, the only difference lies in whether the recessed portion in the conductive silicon substrate 1 is filled with the $SiO_2$ film 38 or is left as the cavity, and the other aspects of the structure and the sizes are the same in the two embodiments.

Next, of the method of manufacturing the radio frequency monolithic integrated circuit diagram according to the present embodiment, the points different from those in the first embodiment will be described referring to FIGS. 11A to 11D. These figures show a longitudinal sectional structure, in essential manufacturing steps, of an essential part of the radio frequency monolithic integrated circuit.

Figure 11A:
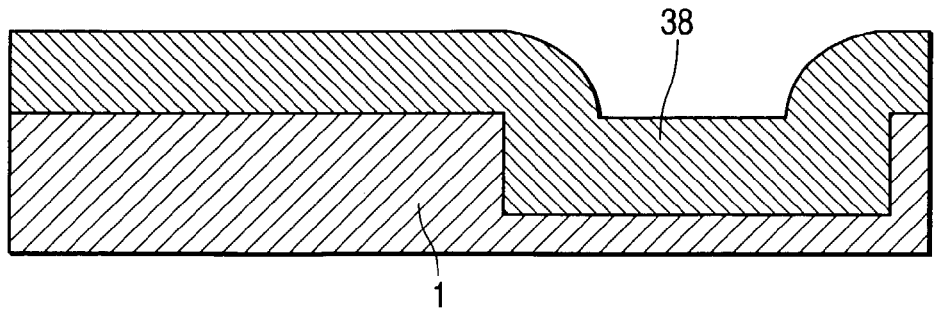
FIGS. 11A to 11D each show a longitudinal sectional structure of an essential part, in essential steps of a method for manufacture, of the radio frequency monolithic integrated circuit according to the fourth embodiment of the present invention.
Figure 11B:
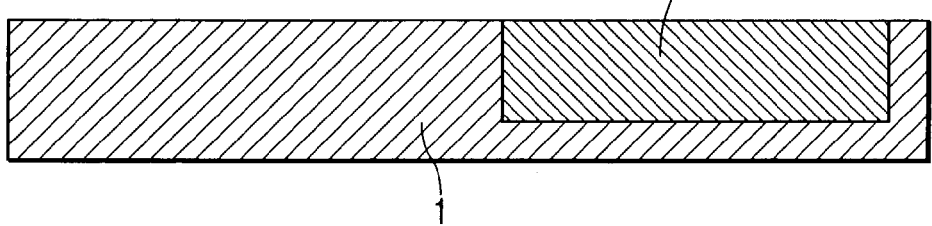

First, a recessed portion with a depth of about 10 $\mu$m is provided in a specified region of the conductive silicon substrate 1 by ordinary photolithography and dry etching, and then the $SiO_2$ film 38 is built up (FIG. 11A). Further, polishing is conducted to remove the $SiO_2$ film 38 on the surface of the substrate, leaving it only in the inside of the recessed portion in the conductive silicon substrate 1 (FIG. 11B).

Figure 11C:
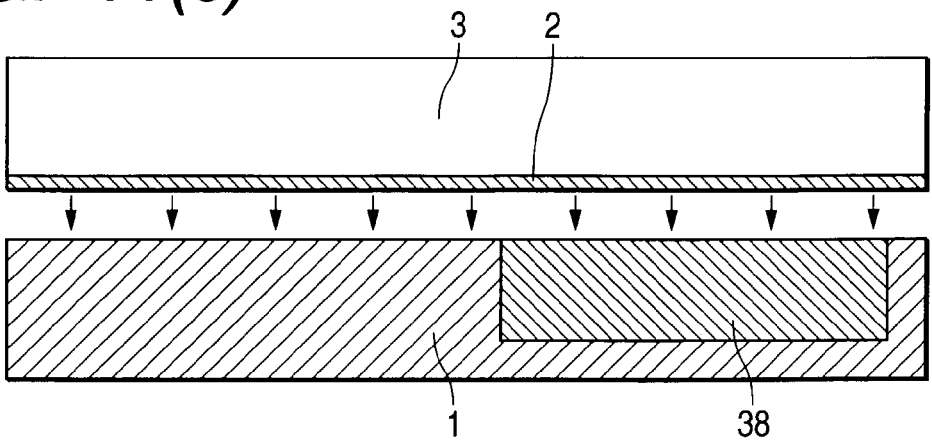
Figure 11D:
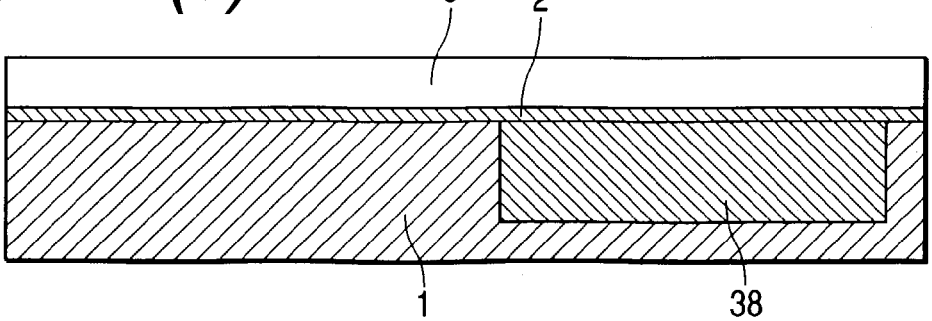

Next, a high resistivity silicon substrate 3 having a resistivity of 1 k$\Omega$·cm and provided thereon with an $SiO_2$ film 2 having a thickness of 0.2 μm is adhered to the conductive silicon substrate 1, with their face sides facing each other. In this step, the $SiO_2$ film 2 may be formed not on the surface of the high resistivity silicon substrate 3 but on the surface of the conductive silicon substrate 1 (FIG. 11C). Next, the two substrates thus adhered are bonded to each other by heating in a nitrogen atmosphere. Further, the high resistivity silicon substrate 3 is thinned, by polishing, to a film with a thickness of about 10 μm (FIG. 1D). The manufacturing steps from this on are the same as in the first embodiment.

Figure 4:
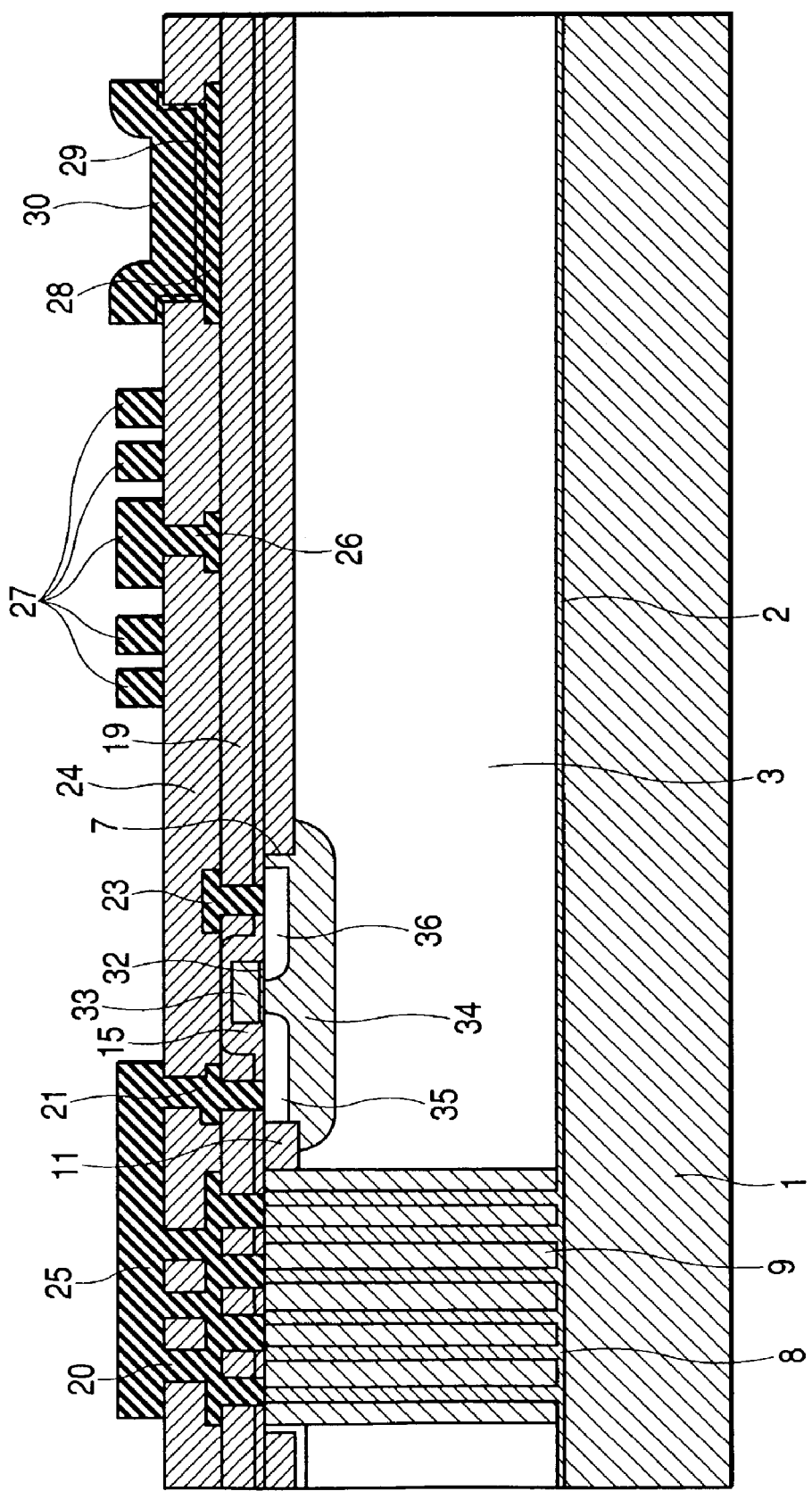
FIG. 4 shows a longitudinal sectional structure of an essential part of a radio frequency monolithic integrated circuit according to a second embodiment of the present invention.
Figure 9:
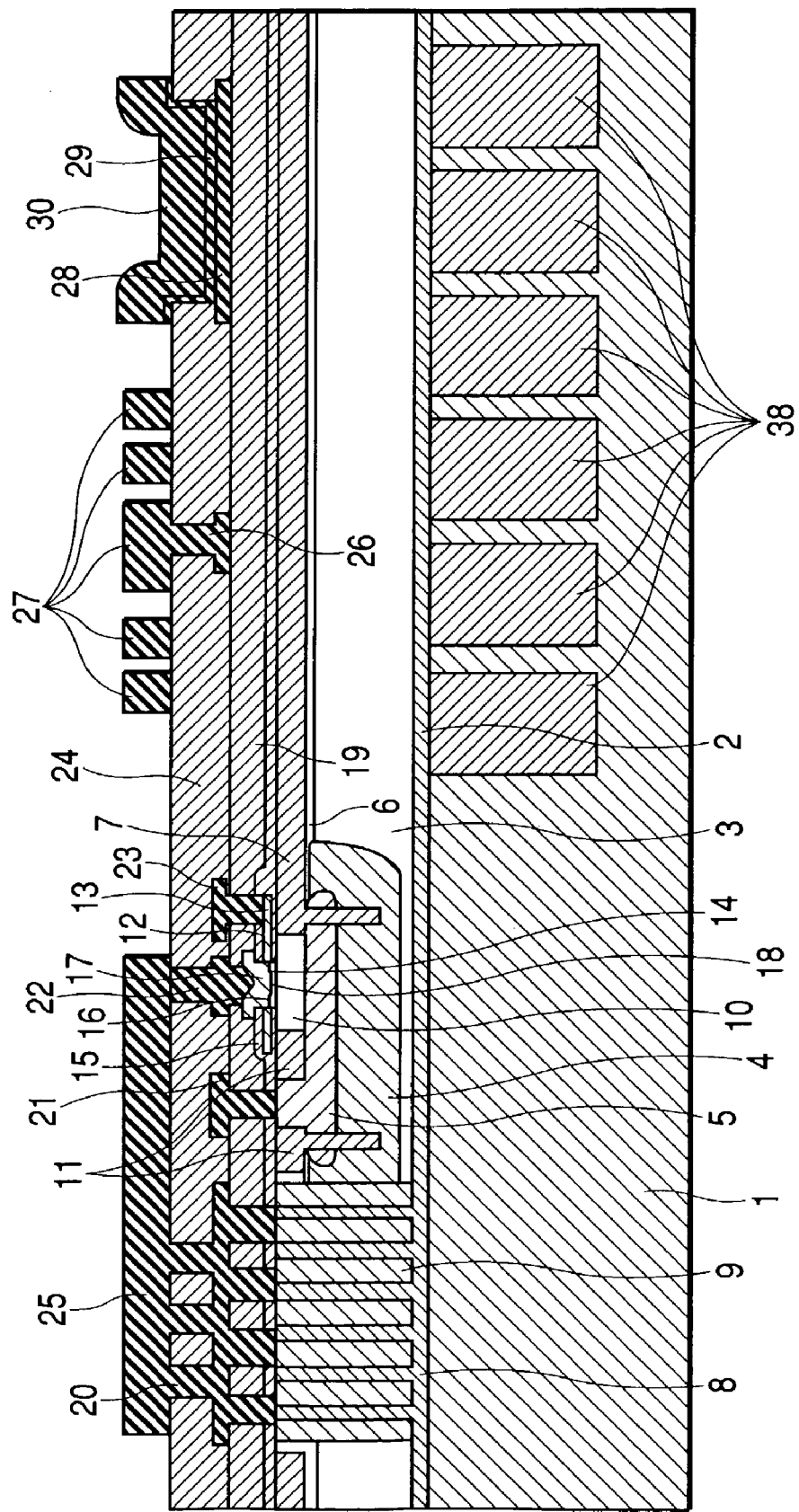
FIG. 9 shows a longitudinal sectional structure of an essential part of one modification of the radio frequency monolithic integrated circuit according to the fourth embodiment of the present invention.

In the present embodiment, other than the method in which one recessed portion is provided in one region where the passive elements are formed, as shown in FIG. 4, a plurality of recessed portions divided into small areas may be provided in one region where the passive elements are formed, as shown in FIG. 9. In that case, it is possible to reduce the built-up thickness of the $SiO_2$ film 38 for filling the recessed portion. In this case also, when the longitudinal direction of the projected region surrounded by the recessed portions is set perpendicular to the direction of the current in the spiral inductor closest thereto as shown in FIG. 12, in the same manner as in the above-described third embodiment, it is possible to further enhance the performance of the spiral inductor.

According to the fourth embodiment, the same effect as in the third embodiment can be realized. Further, as compared with the third embodiment, there is no cavity, so that the stress locally exerted on the high resistivity Si layer 3 in the steps of polishing, heat treatment and the like can be reduced, and the lowering of the yield due to the generation of crystal defects and cracks an be improved.

According to the present invention, in a radio frequency device comprising a transistor arranged on an SOI layer in which a conductive silicon substrate functioning as a ground is used as a support substrate, passive elements such as high-performance spiral inductors, MIM (Metal Insulator Metal) capacitances, microstrip lines and the like can be realized on the chip on which the transistor is mounted.

More specifically, the deterioration of the characteristics of passive elements due to interactions between the conductive silicon substrate and the passive elements which has been the problem in the prior art, such as the loss due to Joule heat generated by the current induced in the conductive silicon substrate by the electromagnetic fields of the passive elements, the lowering of the inductor L-value due to the eddy current induced in the conductive silicon substrate, etc. can be reduced to a level suitable for practical use. As a result, it is possible to realize a radio frequency monolithic integrated circuit being small in size and low in cost and having a high performance comparable to that of a multi-chip module circuit in which passive elements and active elements are provided on different chips.

What is claimed is:

1. A radio frequency monolithic integrated circuit comprising:
    a conductive substrate having a first resistivity;
    a first insulation film formed on a face of said conductive substrate;
    a semiconductor substrate provided on said first insulation film and having a second resistivity higher than said first resistivity;
    a second insulation film provided on said semiconductor substrate;
    an active element formed in one region of said semiconductor substrate;
    a passive element provided on said second insulation film; and
    a conductive region which penetrates through said semiconductor substrate, said first insulation film and said second insulation film and which connects a predetermined terminal of said active element and said conductive substrate to each other.

2. A radio frequency monolithic integrated circuit as set forth in claim 1, wherein the thickness of said semiconductor substrate is greater than the thickness of said second insulation film or the thickness of a metal film formed on said second insulation film.

3. A radio frequency monolithic integrated circuit as set forth in claim 1, wherein the thickness of said semiconductor substrate is greater than the sum of the thicknesses of said second insulation film and said metal film.

4. A radio frequency monolithic integrated circuit as set forth in claim 1, wherein said second resistivity is not less than 100 Ω·cm.

5. A radio frequency monolithic integrated circuit as set forth in claim 1, wherein a recessed portion as a cavity is provided in a region directly beneath said passive element, in said conductive substrate.

6. A radio frequency monolithic integrated circuit as set forth in claim 5, wherein an insulating material is buried in said recessed portion.

7. A radio frequency monolithic integrated circuit as set forth in claim 1, wherein said conductive region in said semiconductor substrate is composed of a plurality of adjacent regions, and a region having a resistivity lower than that of the other regions of said semiconductor substrate is present between said adjacent conductive regions.

8. A radio frequency monolithic integrated circuit as set forth in claim 1, wherein said passive element comprises a microstrip line in which a metal film on said second insulation film is used as an upper electrode, and said semiconductor substrate is used as a lower electrode.

9. A radio frequency monolithic integrated circuit as set forth in claim 1, wherein said active element is a power amplifying transistor, and said passive element is an impedance matching inductor or capacitance or a microstrip line.

10. A radio frequency monolithic integrated circuit as set forth in claim 9, wherein said power amplifying transistor is a bipolar transistor.

11. A radio frequency monolithic integrated circuit as set forth in claim 10, wherein a base layer of said bipolar transistor is made of a silicon-germanium alloy.

12. A method for manufacturing a radio frequency monolithic integrated circuit, comprising the steps of:
    bonding a conductive substrate having a first resistivity and a semiconductor substrate having a second resistivity higher than said first resistivity to each other, with a first insulation film provided on said semiconductor substrate therebetween, and thinning said semiconductor substrate to a film with a predetermined thickness;
    forming a second insulation film on said semiconductor substrate;
    forming an active element in one region of said semiconductor substrate, and forming a passive element on said second insulation film; and
    forming a conductive region which penetrates through said semiconductor substrate, said first insulation film and said second insulation film and which connects a predetermined terminal of said active element and said semiconductor substrate to each other.

13. A method for manufacturing a radio frequency monolithic integrated circuit as set forth in claim 12, further comprising the steps of:

providing a groove which penetrates through said semiconductor substrate, said first insulation film and said second insulation film;

burying a polycrystalline semiconductor material containing an impurity in a high concentration into said groove; and heat-treating said high-concentration impurity to diffuse said impurity into said semiconductor substrate.

14. A method for manufacturing a radio frequency monolithic integrated circuit as set forth in claim 12, further comprising the steps of:

providing a recessed portion in said conductive substrate; and bonding said semiconductor substrate to said conductive substrate provided with said recessed portion, with said first insulation film therebetween.

15. A method for manufacturing a radio frequency monolithic integrated circuit as set forth in claim 14, further comprising the step of burying an insulating material in said recessed portion.

* * * * *